United States Patent [19]
Naffziger

[11] Patent Number: 6,075,386
[45] Date of Patent: Jun. 13, 2000

[54] DYNAMIC LOGIC GATE WITH RELAXED TIMING REQUIREMENTS AND OUTPUT STATE HOLDING

[75] Inventor: Samuel D. Naffziger, Fort Collins, Colo.

[73] Assignee: Hewlett-Packard Company, Palo Alto, Calif.

[21] Appl. No.: 08/955,729

[22] Filed: Oct. 22, 1997

[51] Int. Cl.[7] .............................................. H03K 19/096
[52] U.S. Cl. ............................................. 326/98; 326/121
[58] Field of Search .................... 326/93, 95, 98, 326/112, 119, 121

[56] References Cited

U.S. PATENT DOCUMENTS

| | | |
|---|---|---|
| 5,329,176 | 7/1994 | Miller, Jr. et al. . |
| 5,343,096 | 8/1994 | Heikes et al. . |
| 5,389,835 | 2/1995 | Yetter ........................................ 326/98 |
| 5,392,423 | 2/1995 | Yetter ........................................ 395/550 |
| 5,434,520 | 7/1995 | Yetter et al. ............................... 326/93 |
| 5,440,243 | 8/1995 | Lyon .......................................... 326/33 |
| 5,550,487 | 8/1996 | Lyon .......................................... 326/33 |
| 5,557,620 | 9/1996 | Miller, Jr. et al. ...................... 371/22.5 |
| 5,757,205 | 5/1998 | Ciraula et al. ............................. 326/95 |
| 5,764,089 | 6/1998 | Partovi et al. ........................... 327/200 |
| 5,796,282 | 8/1998 | Sprague et al. ........................... 326/98 |
| 5,859,547 | 1/1999 | Tran et al. ................................. 326/98 |

FOREIGN PATENT DOCUMENTS

WO95/08872  3/1995  WIPO ....................................... 19/96

Primary Examiner—Jon Santamauro
Assistant Examiner—Don Phu Le
Attorney, Agent, or Firm—Augustus W. Winfield

[57] ABSTRACT

A dynamic logic gate having a short precharge period during an evaluation phase of a clock and a tri-state hold period during a precharge phase of the clock. The evaluation time is extended into the precharge phase. As a result of extended evaluation time and no latching set-up time, evaluation timing for upstream logic is relaxed since upstream logic is not required to evaluate before the worst case time for the clock to enter the precharge phase. The gate provides the function of latching without the delay of latching. As a result of holding during the precharge phase of the clock, one latch is eliminated for testing. As a result of tri-stating during the precharge phase of the clock, control during testing is simplified. In a single-rail embodiment, the short precharge period is open loop. In a dual-rail implementation, the precharge period ends when both evaluation nodes are charged. In the dual-rail implementation, both evaluate nodes are tri-stated as soon as one node discharges, thereby providing first incidence latching.

6 Claims, 3 Drawing Sheets

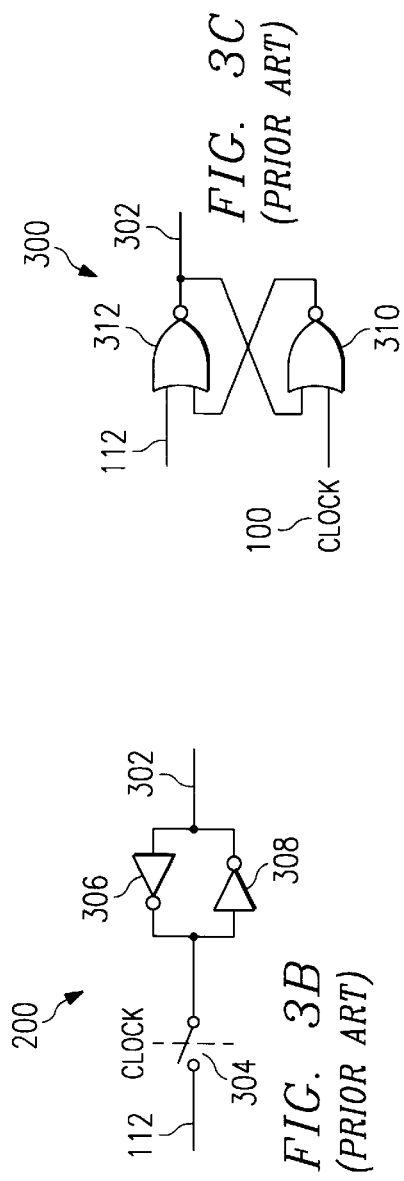
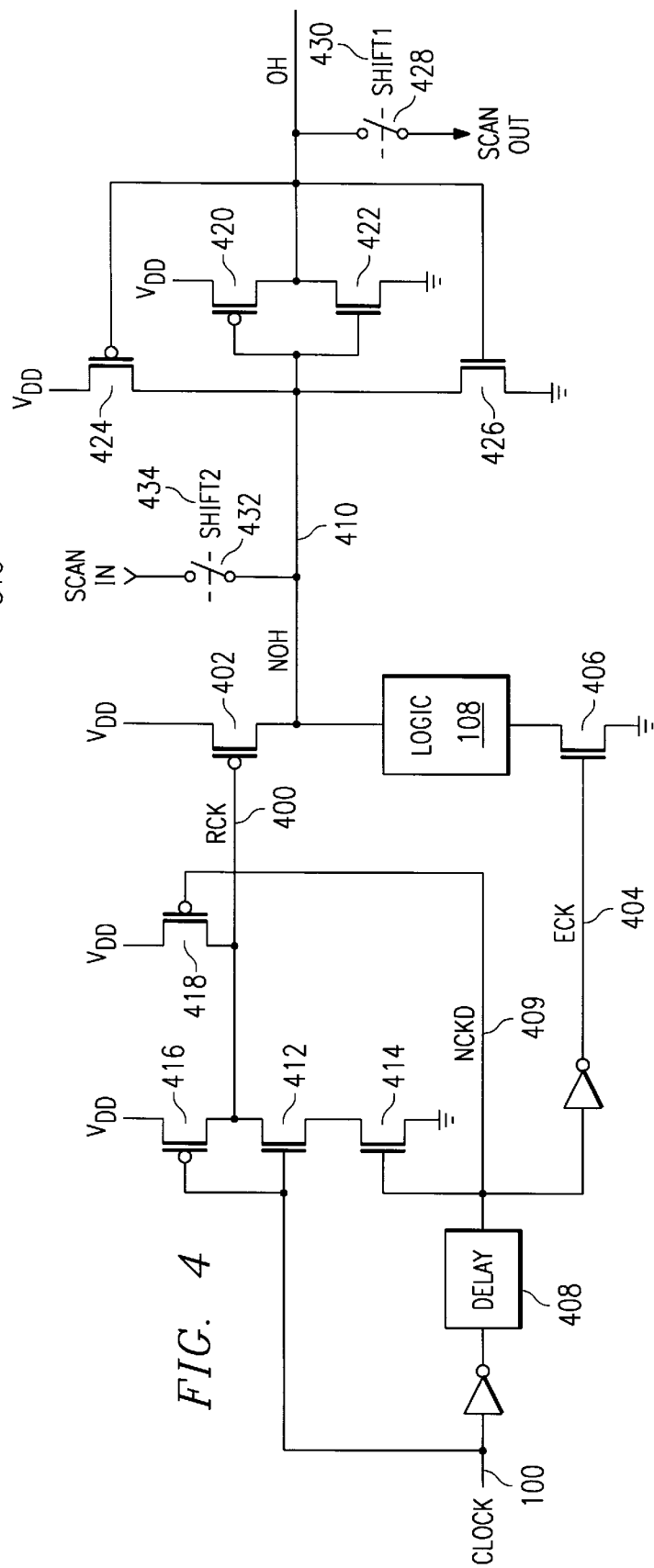

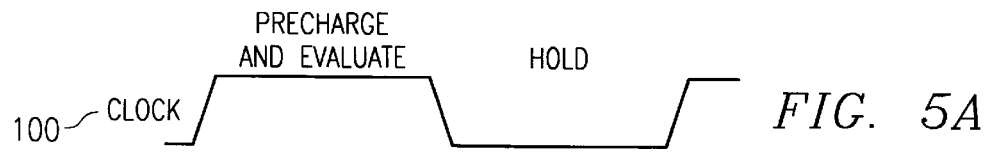
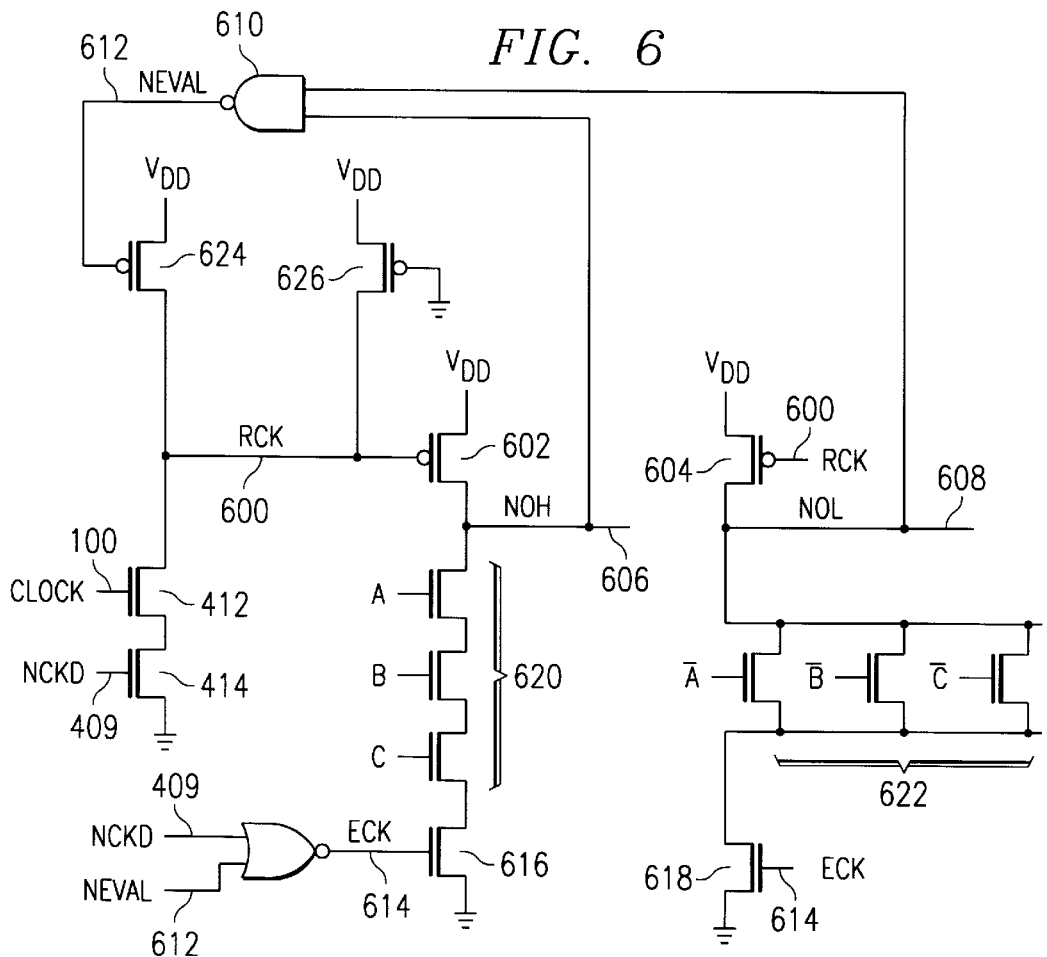

DYNAMIC LOGIC GATE WITH RELAXED TIMING REQUIREMENTS AND OUTPUT STATE HOLDING

FIELD OF INVENTION

This invention relates generally to digital logic circuitry and more specifically to dynamic logic gates.

BACKGROUND OF THE INVENTION

For dynamic logic gates, a capacitance is charged during a precharge clock phase and the capacitance is conditionally discharged during an evaluate clock phase, depending on the logical combinational state of logic circuitry. FIG. 1 illustrates a simplified prior art MOS single-rail domino dynamic logic gate. The term "single-rail" means that logical TRUE or FALSE is determined by whether a single evaluation node (110) is high or low. In contrast, dual-rail gates have two evaluation nodes and generalized "mouse-trap" gates may have an arbitrary number of evaluation nodes. The term "domino" means that the gate has an inverting buffer (114) on the output. In FIG. 1, when clock 100 is low (precharge phase), transistor 102 charges the evaluation node capacitance 104 to the supply voltage $V_{DD}$. When clock 100 is high (evaluation phase), transistor 106 conditionally discharges the evaluation node capacitance 104 depending on the logical combinational state of logic circuitry 108.

FIGS. 2A and 2B illustrate timing for the dynamic logic circuit of FIG. 1. FIG. 2A illustrates the clock waveform and FIG. 2B illustrates the voltage on node 110. In FIG. 2A, when the clock goes low (precharge state), the voltage on node 110 (FIG. 2B) is driven high. For efficiency, the precharge transistor 102 (FIG. 1) is typically small, sometimes requiring most of the precharge time to charge the node capacitance 104. When the clock goes high (evaluate state), node 110 is high (precharged) and sometime during the evaluate state the node capacitance 104 may be discharged (node 110 pulled low) by the logic circuitry. Note that the evaluation is "monotonic." That is, during the evaluate phase, if node 100 goes low it cannot go high again during the evaluate phase, since once node 110 is discharged the node remains discharged for the duration of the evaluate phase.

Note in particular that the clock 100 inevitably has some jitter, depicted in FIG. 2A where clock 100 has a nominal fall time 200, a worst case late fall time 202 and a worst case early fall time 204. For gates as illustrated in FIG. 1, evaluation must be complete before the worst case early fall time 204 for clock 100. As will be discussed in further detail below, series delay and latching set up times place an additional constraint on evaluation time, requiring evaluation to be complete substantially earlier than the worst case early fall time 204 for clock 100.

In FIG. 1, typically the output 112 is invalid during the entire precharge phase. When dynamic gates are connected as inputs to static logic or to dynamic logic having a different clock phase, the outputs of the dynamic gates typically must be latched to provide valid outputs during the precharge phase. With proper timing and separate delayed clock signals in addition to regular clock signals, some latches may be not be needed, but in general, latches are needed to preserve states during precharge. In addition, latches are needed for test (discussed in more detail below).

FIG. 3A illustrates the logic gate of FIG. 1 with a latch 300 on the output. One common configuration for the output latch 300 is illustrated in FIG. 3B. In FIG. 3B, the transistors forming the inverters 306 and 308 are relatively small so that the output of inverter 306 can be overdriven by inverter 114 (FIG. 3A). In FIG. 3B, with switch 304 conducting, for a low-to-high transition (that is, when logic 108 evaluates to discharge node 110), there is some delay due to the finite resistance of switch 304 followed by additional delay as inverter 306 "fights" to prevent the input 112 from rising. Therefore, the circuit of FIG. 3B adds some delay before the result of an evaluation propagates to downstream logic. An improvement is shown in FIG. 3C. With cross-coupled NOR gates 310 and 312 as illustrated, the clock 100 will go high for the evaluate state substantially earlier than a transition on input 112 resulting from evaluation. Then, input 112 only needs to change the state of a single transistor with no "drive fights." However, there is still some delay. When data is latched after evaluation, the data must be stable for a period of time before the latching clock transition, called a set-up time. For example, for the circuit of FIG. 3B, the data must be stable sufficiently early to permit a delay through switch 304 before clock 100 falls. The latch of FIG. 3C does not have a set-up time requirement. Referring again to the timing diagrams of FIGS. 2A and 2B, in general, evaluation must be complete sufficiently earlier than the worst case early fall time 204 of clock 100 to account for worst case latch set-up time and any series delay between the evaluation node and the latch.

An additional requirement for logic gates is testing. It is common to include circuitry to capture the state of internal circuitry and to bring the captured states out to a test pin where the states are serially read. In addition, test circuitry may be used to control the state of internal circuitry. A commonly used standard for such test circuitry is IEEE Std. 1149.1-1990, *IEEE Standard Test Access Port and Boundary-Scan Architecture*, available from The Institute of Electrical and Electronic Engineers, Inc., 345 East 47th Street, New York, N.Y. 10017-2394. IEEE Std. 1149.1 defines a standard serial interface through which test instructions and test data are communicated. The technique involves the inclusion of a shift-register stage adjacent to each node of interest so that signals at nodes of interest can be controlled and observed. The special shift-registers and test instructions can be used in isolated component testing and in testing individual components assembled into larger systems. In general, there is a need to minimize the overhead of the circuitry required to observe and control internal logic nodes through boundary scan testing. Preferably, instead of additional shift-register stages dedicated to testing, output latches as illustrated in FIG. 3A (300) are also used for boundary scan testing. However, testing typically requires more complex latches than those illustrated in FIGS. 3B and 3C. In particular, the observed output needs to be latched before the output is changed (controlled) by the test system, typically requiring a master/slave latch arrangement. In addition, in FIG. 1, if the clock is stopped, node 110 cannot be controlled if the precharge transistor 102 is on or if the logic evaluates to discharge node 100 and the evaluation transistor 106 is on. Therefore, a bidirectional isolation switch (as in switch 304 of FIG. 3B) is required between node 110 and the node being controlled. An isolation switch adds delay.

There is need for an improved dynamic logic gate with: (1) relaxed timing requirements for the completion of upstream evaluation (2) output holding during the precharge phase, and (3) simplified observability and controllability.

SUMMARY OF THE INVENTION

A dynamic logic gate is disclosed that has the following timing characteristics:

(a) the gate precharges during the first half of the evaluation phase;

(b) the gate evaluates during the remaining portion of the evaluation phase and may continue to evaluate partially into the precharge phase;

(c) the evaluation node voltage is statically held in a tri-state condition during the precharge phase.

As a result, the timing requirements on upstream logic are substantially relaxed because upstream logic is not required to complete evaluation before the falling edge of the clock and since the gate itself is functioning as a latch there is no explicit latching delay. With extended evaluation and hold, the resulting gate is particularly useful as the interface between dynamic logic and static logic, or as the interface between dynamic logic having evaluation during one clock phase and dynamic logic having evaluation during the opposite clock phase. Since the logical state is statically held during the precharge phase, the gate provides the functionality of a latch without the delay of a latch. Finally, since the gate output is effectively tri-stated during the precharge phase, the state can be easily overdriven for test control.

A dual-rail embodiment is also disclosed, which in addition to the above advantages effectively provides first-incidence latching, thereby preventing an illegal output state.

BRIEF DESCRIPTION OF THE DRAWINGS

FIG. 3B (prior art) is a block diagram schematic illustrating additional detail for an example of the output latch of FIG. 3A.

FIG. 3C (prior art) is a block diagram schematic illustrating additional detail for an alternative example of the output latch of FIG. 3A.

FIG. 4 is a simplified block diagram schematic for an example embodiment of a single-rail dynamic logic gate in accordance with the invention.

FIGS. 5A–5D are timing diagrams of waveforms related to the circuit of FIG. 4.

FIG. 6 is a block diagram schematic of an example dual-rail embodiment of the invention.

DETAILED DESCRIPTION OF THE PREFERRED EMBODIMENT OF THE INVENTION

Figure 1:
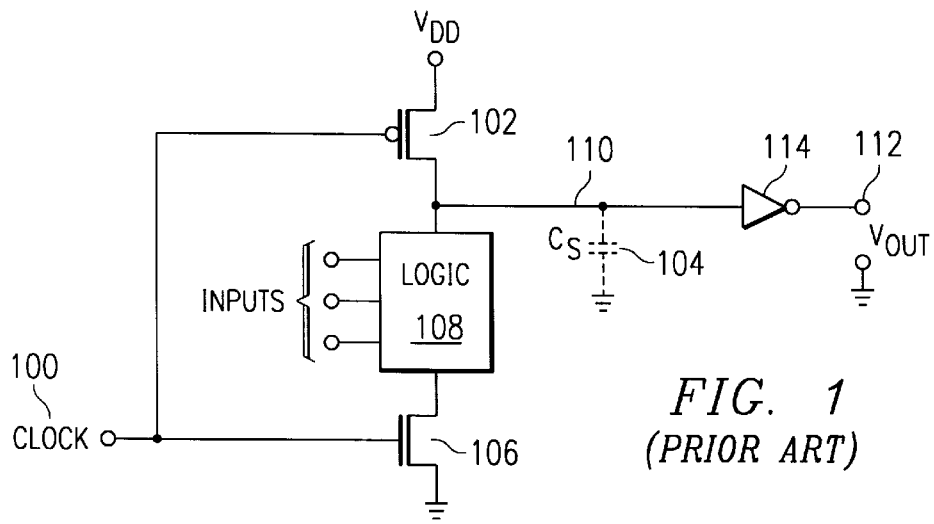
FIG. 1 (prior art) is a block diagram schematic of a single rail dynamic logic gate.
Figure 2A:
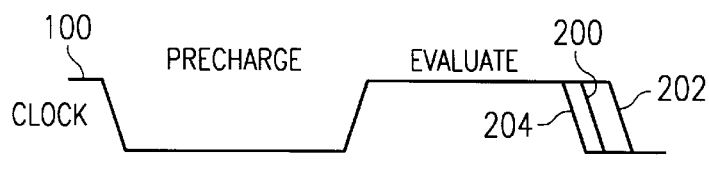
FIGS. 2A and 2B (prior art) are timing diagrams for signals related to the circuit of FIG. 1.
Figure 2B:
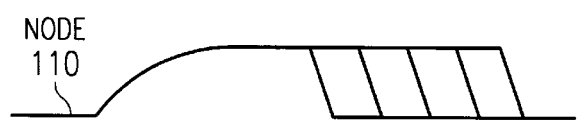
Figure 3A:
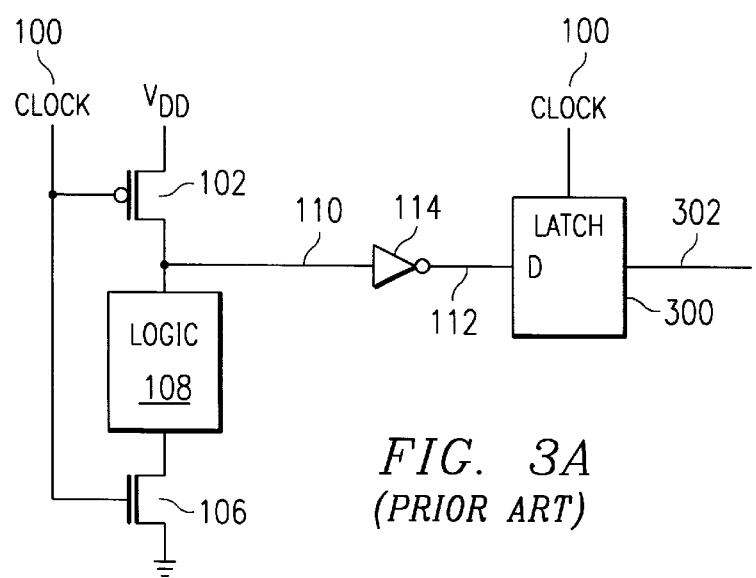
FIG. 3A (prior art) is a block diagram schematic of the logic gate of FIG. 1 with an output latch.

FIG. 4 illustrates an example embodiment of a single-rail dynamic logic gate in accordance with the invention. Recall from FIGS. 1 and 2A that the circuit of FIG. 1 precharges when clock 100 is low and evaluates when clock 100 is high. In contrast, the circuit in FIG. 4 precharges for a very brief time at the beginning of the phase when clock 100 is high, evaluates immediately after precharge, and evaluation continues beyond the time when clock 100 goes from high to low. In addition, the evaluation node is effectively tri-stated after evaluation throughout the remaining part of the phase when clock 100 is low. During the tri-stated period, the evaluation node is "weakly" held (by physically small transistors) to prevent drifting (particularly if the clock is stopped for testing) but can be easily overdriven for control during testing.

For the gate in FIG. 4, two separate clock signals are derived from the main clock 100. A reset clock RCK 400 controls a precharge transistor 402. An evaluate clock ECK 404 controls an evaluate transistor 406. When clock 100 goes high, RCK 400 pulses low for a time determined by a delay circuit 408 and then returns high. RCK 400 pulses low just long enough to ensure that precharge transistor 402 completely charges the evaluation node NOH 410. Transistor 402 is larger than typical precharge transistors, charging the evaluation node 410 in less than half of the high phase of clock 100. At the same time that precharge transistor 402 turns off, ECK 404 goes high and evaluate transistor 406 is turned on. After clock 100 goes low (delay 408), NCKD 409 goes high and the evaluation transistor 406 turns off. As a result, during the remaining part of the low phase of clock 100, both transistors 402 and 406 are off, effectively tri-stating the evaluation node 410.

Just before clock 100 goes from low to high, transistor 412 is off, transistor 414 is on, transistor 416 is on (RCK is high) and transistor 418 is off. When clock 100 goes high, transistor 416 is turned off and transistor 412 is turned on, which pulls RCK low, which turns on precharge transistor 402. After delay 408, NCKD 409 goes low, turning transistor 414 off and transistor 418 on, which pulls RCK high, which turns off the precharge transistor 402. When clock 100 goes from high to low, transistor 412 is turned off and transistor 416 is turned on, so that RCK remains high. Delay 408 may be a series of inverters (even number) or may be a simple RC filter.

Transistors 420 and 422 form an inverter. Transistors 424 and 426 weakly hold the state of evaluation node 410. Transistors 424 and 426 are physically small, providing just enough current to prevent drift of evaluation node 410 if the clock is paused for test but easily overdriven during testing. Transistor 426 is optional.

FIG. 4 also illustrates that tri-stating the evaluation node 410 with a weak hold ability greatly simplifies control during test. A master clock may be halted and clock 100 may be independently controlled or forced for test. If clock 100 is halted in a low state, all gates as in FIG. 4 are then in a hold phase. For all gates like the gate of FIG. 4, the held state of node 410 may be read via switch 428 to a test latch as controlled by a first test signal SHIFT1 (430). The need for one physical test latch is eliminated because the state of node 410 is held. Then, a new state may be forced onto node NOH 410 through switch 432 as controlled by a second test signal SHIFT2 (434). If node NOH 410 was not tri-stated, isolation switches (with their inherent delay) would be needed to enable NOH 410 to be overdriven. Clock 100 may then be cycled so that all downstream logic evaluates to test evaluation with known inputs. Note that in some systems SHIFT2 may simply be the inverse of SHIFT1.

The timing for the circuit of FIG. 4 is illustrated in FIGS. 5A–5D. FIG. 5A illustrates clock 100 as in FIG. 2A, but with different definitions of the phases. The high phase is now called "precharge and evaluate" and the low phase is called "hold." FIG. 5B illustrates the reset clock RCK 400. Note that RCK goes low when clock 100 goes high and goes high again after a short delay. FIG. 5C illustrates signal NOH 410, which is the evaluation node voltage. Note that NOH may be driven low as a result of logic evaluation, or it may remain high as a result of logic evaluation. FIG. 5D illustrates the evaluation clock ECK 404. Note that RCK 400 and ECK 404 go high at the same time, delayed by delay 408 after clock 100 goes high. As long as ECK is high, the logic circuit is in an evaluation mode. ECK goes low after clock 100 goes low, delayed by delay 408.

Note in particular in FIG. 5D that the gate of FIG. 4 eliminates the need for evaluation to be completed before the worst case early fall time of clock 100. In fact, evaluation "cycle steals" partially into the phase where clock 100 is low, continuing for a brief time after clock 100 falls as upstream logic is entering the precharge phase. Therefore, the timing requirements for upstream logic are substantially relaxed and sensitivity to clock jitter is reduced. Finally, note that holding the state of NOH throughout the precharge phase provides the function of a latch without the delay or set-up time of a latch. As a result of late evaluation and holding, the gate of FIG. 4 is particularly useful as the interface between dynamic logic and static logic. Alternatively, the gate of FIG. 4 is particularly useful as the interface between dynamic logic having evaluation during one clock phase and dynamic logic having evaluation during the opposite clock phase.

FIG. 6 illustrates a simplified dual-rail gate in accordance with the invention. To simplify the illustration, some parts that are the same as in FIG. 4 are omitted. A dual-rail gate has two inputs for each logical input signal (the logical input signal and the complement of the logical input signal) and has two outputs (a normal output and the complement of the normal output). Reset clock 600 has a weak (physically small) pull-up transistor 626 that is just sufficient to keep RCK from drifting low when all transistors driving RCK are off. When clock 100 goes high, RCK 600 goes low and both precharge transistors 602 and 604 turn on. After the delay (FIG. 4, 408) NCKD goes low, turning off transistor 414. Even though transistor 414 turns off, RCK and the gates of the precharge transistors 602 and 604 remain low unless actively pulled high. The small pull-up transistor 626 can slowly pull RCK and the gates of transistors 602 and 604 high, but before that happens both evaluation nodes 606 and 608 are charged. When both evaluation nodes 606 and 608 are charged, logical AND gate 610 turns on transistor 624, pulling RCK 600 high and turning off both precharge transistors. At the same time, the logical AND gate 610 via signal NEVAL 612 causes both evaluation transistors 616 and 618 to turn on (note that NCKD 409 goes low before NEVAL goes low, as discussed above). One group of transistors 620 is configured as a logical AND gate, requiring signals A, B, and C to all be high to cause node NOH 606 to be discharged during evaluation. A second group of transistors 622 is configured as a logical OR gate, discharging node NOL 608 if the inverse of any one of signals A, B, and C is high. If signals A, B, and C are high, node NOH 606 is discharged and node NOL 608 remains high. For any other logical states for A, B, and C, node NOL is discharged and node NOH remains high. For the dual-rail gate illustrated in FIG. 6, when either node NOH or NOL discharges, logical AND gate 610 via signal NEVAL 612 causes both evaluation transistors 616 and 618 to be turned off. Then, both nodes NOH and NOL are effectively tri-stated and weakly held. With complementary input signals, one evaluation node is guaranteed to discharge, so that after evaluation, both evaluation nodes are tri-stated during both phases of the clock. Therefore, there is no need to force clock 100 low for test.

The dual-rail gate of FIG. 6 has all the advantages of the single-rail gate of FIG. 4: it eliminates the need for evaluation to be completed before the worst case early fall time of clock 100; evaluation may "cycle steal" into the phase where clock 100 is low, continuing until valid inputs cause the gate to evaluate; it provides the function of a dual-rail latch without the delay of a latch; and both tri-stated outputs may be easily overdriven for test control. In addition, since discharge of either NOH or NOL causes both nodes to immediately go into a hold mode, the gate effectively provides first incidence latching, thereby actively preventing an illegal output state. That is, the gate prevents NOH and NOL from both being inadvertently discharged because of a race condition among the inputs or a glitch on one of the inputs. Still another advantage is that upon evaluation, the gate tri-states itself, so that the evaluation clock does not need to be forced low for test scanning.

The foregoing description of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A method of controlling a dynamic logic gate, the method comprising the following steps:

receiving a clock signal having a first transition defining a beginning of a first phase and a second transition defining a beginning of a second phase;

precharging starting at the first clock transition and ending before the second transition; and enabling evaluation after precharging has ended and before the second transition.

2. The method of claim 1 further comprising:

disabling precharging and evaluation during part of the second phase.

3. The method of claim 1 further comprising:

holding a voltage on an evaluation node during the second phase.

4. A dynamic logic gate, the dynamic logic gate receiving a clock signal having a first phase and a second phase, the dynamic logic gate comprising:

an evaluation node;

a precharge switch, connected between a first power supply potential and the evaluation node so that a voltage on the evaluation node approaches the first power supply potential when the precharge switch is closed;

a delay circuit having an input and an output, the input receiving the clock signal;

a precharge control circuit receiving the clock signal and the output of the delay circuit and connected to the precharge switch;

the precharge switch being controlled by the precharge control circuit to close at a beginning of the first phase and opening after a fixed delay and before a beginning of the second phase.

5. The dynamic logic gate of claim 4 further comprising:

an evaluation switch;

logic circuitry, the logic circuitry connected between the evaluation node and the evaluation switch and the evaluation switch connected between the logic circuitry and a second power supply potential;

evaluation control circuitry receiving the output of the delay circuit and connected to the evaluation switch; and the evaluation switch being controlled by the evaluation control circuitry to close after the fixed delay after the beginning of the first phase.

6. The dynamic logic gate of claim 4 further comprising:

the precharge switch and the evaluation switch being controlled to stay open during the second phase.

* * * * *